United States Patent [19]

Bernzweig

[11] Patent Number: 4,644,290

[45] Date of Patent: * Feb. 17, 1987

[54] METAL DETECTOR AUDIO AMPLIFIER

[76] Inventor: David S. Bernzweig, 24 Raleigh Rd., Framingham, Mass. 01701

[*] Notice: The portion of the term of this patent subsequent to Jun. 10, 2003 has been disclaimed.

[21] Appl. No.: 829,237

[22] Filed: Feb. 14, 1986

Related U.S. Application Data

[63] Continuation-in-part of Ser. No. 531,295, Sep. 12, 1983, Pat. No. 4,594,559.

[51] Int. Cl.⁴ .......................... H03F 1/26; G01V 3/11
[52] U.S. Cl. ..................................... 330/149; 324/329
[58] Field of Search ....................... 330/278, 279, 149; 328/171; 307/559; 324/326–329

[56] References Cited

U.S. PATENT DOCUMENTS 4,376,267  3/1983  Chu et al. ............................. 330/284

Primary Examiner—Gene Wan
Attorney, Agent, or Firm—William Nitkin

[57] ABSTRACT

An accessory device for use with a metal detector with means to amplify the low, barely audible audio output of the metal detector so that it can be easily heard with further means to dampen louder audio output signals causing those signals to be softer.

5 Claims, 6 Drawing Figures

METAL DETECTOR AUDIO AMPLIFIER

This application is a continuation-in-part of my previous application of the same title filed 9/12/83, Ser. No. 531,295 now U.S. Pat. No. 4,594,559.

BACKGROUND OF THE INVENTION

1. Field of the Invention

The device of this invention is in the area of metal detectors and more particularly relates to a device provided as an accessory or incorporated into headphones for amplifying the low volume audible signals while dampening signals of above a predetermined volume.

2. History of the Prior Art

Meal detectors used by individuals can emit an audible signal when their search coil passes over buried metal objects. When objects are near the surface, the metal detector produces a loud audible signal while objects that are more deeply buried will cause the detector to emit a softer, less audible signal. These less audible signals often represent more valuable objects such as older coins and artifacts. To hear these less audible signals better, the metal detector user will often use earphones connected to the metal detector which brings the audible signal close to the ear and blocks out other distracting sounds from the environment making it easier for the user to hear the softer signals. Unfortunately when detecting buried metal objects located close to the surface, the loud signal generated can then hurt the user's ears. Further, many times deeply buried objects cause the metal detector to produce an audible signal so soft that even with the aid of earphones, the signals are inaudible.

SUMMARY OF THE INVENTION

It is an object of this invention to provide an amplifier for metal detectors which amplifies barely audible signals so that they can be easily heard and which also dampens loud signals so that they do not hurt the user's ears. The device in one embodiment can be contained within a small casing which is attached to the metal detector. One method of attachment can be by the use of Velcro strips so that the amplifier is removable and reattachable. A coiled electric cable extends from the device's input and is plugged into the audio output jack of the detector. A line extends from the earphone to the device of this invention and is plugged into the device's output jack. The device can also be incorporated in one embodiment into the headphone of the detector. The device of this invention acts effectively to increase the sensitivity of the metal detector because it increases the user's ability to tune the detector. Typical metal detectors have two wound coils in their search heads, eacn tuned to the other. A control knob allows the user to adjust the tuning by turning the audible sound created by the two coils down to just were it is no longer audible. If the sound is soft then it may be difficult to fine tune the detector as the tuning may not be perfect. With the signal amplified from the device of this invention, the coils can be more perfectly balanced and the detector will operate with a higher sensitivity than if it were not perfectly tuned.

DESCRIPTION OF THE PREFERRED EMBODIMENT(S)

Figure 1:
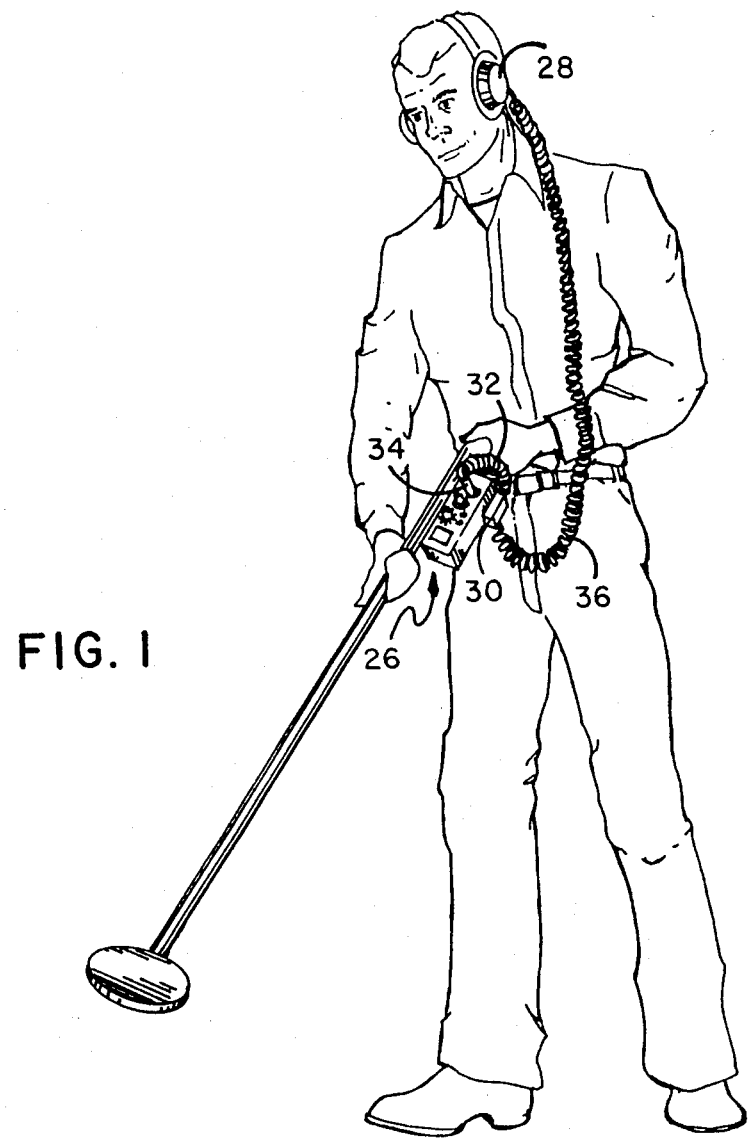
FIG. 1 illustrates a metal detector in use with the device of this invention which is held within a casing attached thereto.

FIG. 1 illustrates an individual utilizing a metal detector 26 having the device 30 of this invention held within a casing attached thereto. The device is interconnected to the metal detector by cable 32 with jack 34 inserted into the audio output of the detector. A second cable 36 extends from earphone 28 to the jack of the device of this invention. This embodiment of the device of this invention is small and lightweight, does not interfere at all with the use of the metal detector and, as mentioned above, can be attached to the detector by any removable and reattachable means such as by Velcro strips, snaps, slide clips or any equivalent method of fastening.

Figure 2:
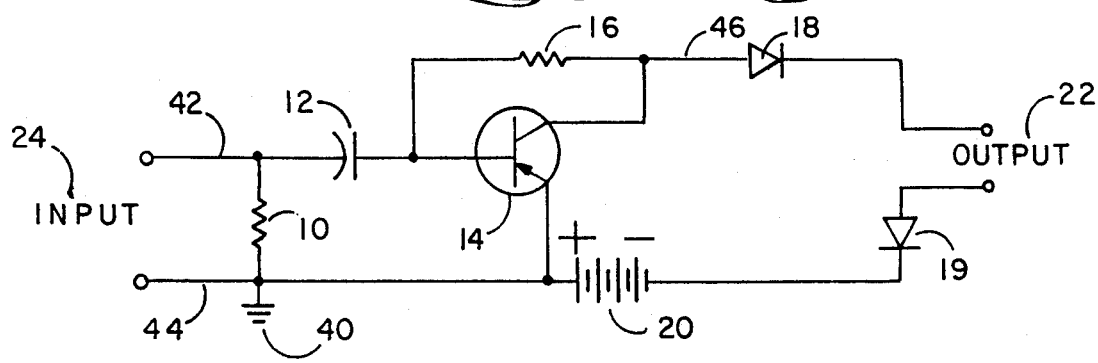
FIG. 2 is a schematic of one embodiment of the circuit of the device of this invention.

FIG. 2 illustrates one embodiment of the circuitry of the device with cable 32 not shown to be attached to input 24 carrying the signals of metal detector 26 to input 24. First input line 42 extends from the input 24 to the base of transistor 14. Between input 24 and transistor 14 on line 42 is capacitor 12 which can be a 1 microfarad capacitor or equivalent. Before capacitor 12 on line 42 and before the emitter of transistor 14, the first and second input lines are interconnected by resistor 10 which can be a 1K resistor or equivalent which is grounded at interconnection point 40. Transistor 14 can be a 2N4403 transistor or equivalent. The collector of transistor 14 is interconnected by a feedback loop through resistor 16 which can be a 3.3K resistor or equivalent to first input line 42 between capacitor 12 and the base of transistor 14. On second input line 44 after resistor 10 is battery 20 which can be a 1.5 volt AA penlight battery or an equivalent electrical source providing 1.5–3 VDC. The emitter of transistor 14 is interconnected on the second input line 44 between resistor 10 and battery 20. First output line 46 extends from the collector of transistor 14 through diode 18 to one pole of output 22. Diode 18 is directed to conduct electricity away from transistor 14. Second output line 48 extends from the negative pole of battery 20 through diode 19 to the other pole of output 22. Diode 19 is directd to conduct electricity toward battery 20. Output 22 is interconnected by a jack direct connection or equivalent means to cable 36 to carry the signal to earphones 28. The transistor and its related circuitry amplify the input signal while diodes 18 and 19 act as a sound dampener cutting off the amplitude of louder signals making their sound softer at the output while not effecting the amplified lower volume signals. When the device is not in use there is no power drain on the battery as the circuit only becomes operative when the earphone is plugged into the output jack or if the earphones have a direct connection, then when the input cable 32 is plugged into the metal detector.

Figure 3:
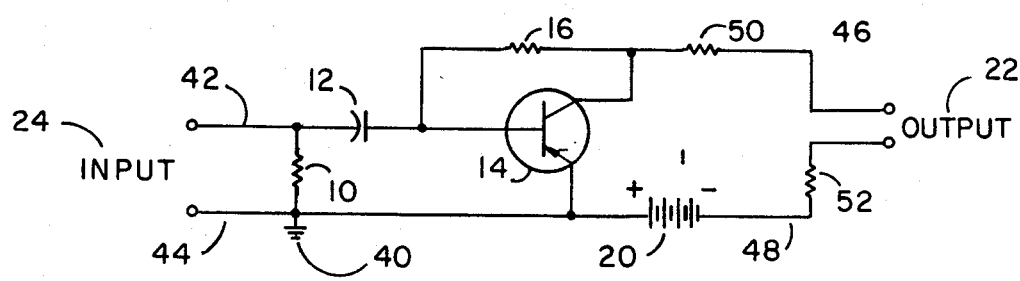
FIG. 3 is a schematic of another embodiment of the circuit of the device of this invention.

FIG. 3 illustrates an alternate embodiment of a circuit similar to that in FIG. 2 except the diodes are replaced by resistors 50 and 52, each of which can be 22 ohm resistors or equivalent. This circuit exhibits a faster reaction time than that of the circuit of FIG. 2 and tends to reduce loud sounds more yet allow weak signals to come through with more clarity.

Figure 4:
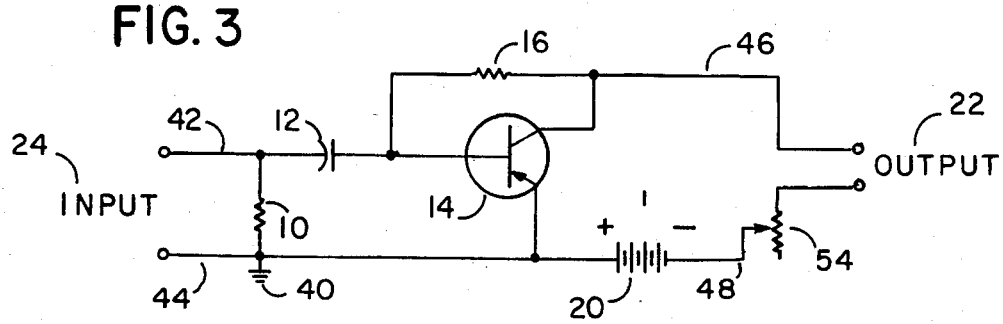
FIG. 4 is a schematic of yet another embodiment of the circuit of the device of this invention.

FIG. 4 illustrates an alternate embodiment without the resistors of FIG. 3 but with a variable resistor such as a 100 ohm potentiometer or equivalent. Devices with the circuit of FIG. 4 allow for fine tuning of the potentiometer to the adjustment of the intensity of the strong and weak signals from the metal detector.

Figure 5:
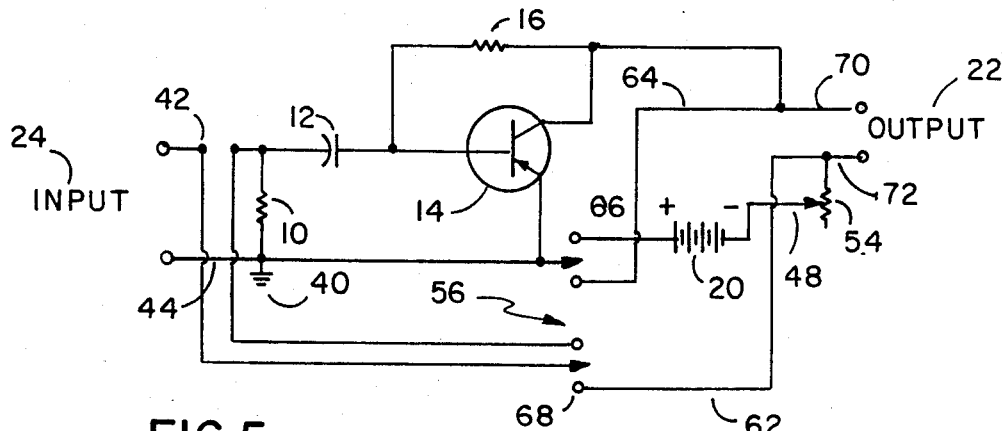
FIG. 5 is a schematic of still yet another embodiment of the circuit of the device of this invention suitable for use in headphones.

FIG. 5 shows an alternate version from that illustrated in FIG. 4 with switch 56 to turn the circuit on or off when desired. When switch 56 is off, input 24 is connected directly to output 22. Switch 56 can be a double pole double throw switch of either slide or rotary type which when on allows the device of this invention to be used in the circuit and one can then adjust the potentiometer as reviewed above to the best setting for his hearing. Line 42 is directed down line 58 to first pole 68 of switch 56 which switch when in a down position connects line 42 to line 62 which extends to line 72 being one pole of outlet 22. When switch 56 is in an up position, it directs the signal from line 58 back to line 42 along line 60 for the device of this invention to be engaged. Line 44 from input 24 extends to the second pole of switch 56 and when in a down position connects to line 64 which runs to line 70 being the other pole of outlet 22 so that when switch 56 is in a down position, input 24 is connected directly to output 22 and the device of this invention is bypassed. When second pole 66 of switch 56 is in an upwards position, it completes line 44 to battery 20 and when first pole 68 is in an up position, the device of this invention is on.

Figure 6:
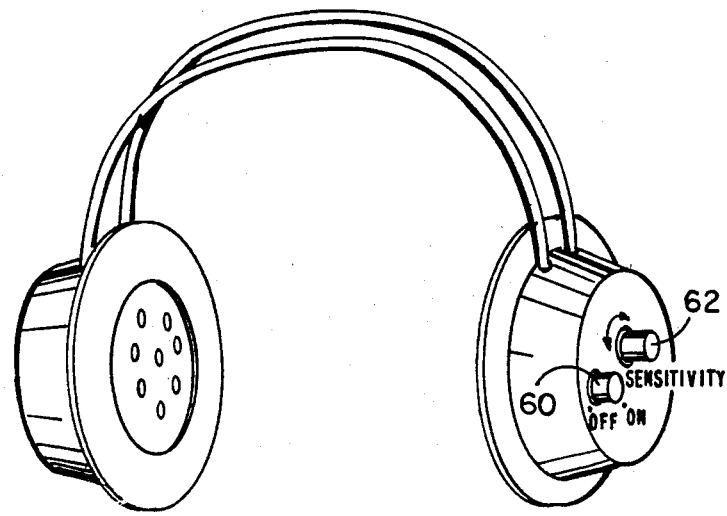
FIG. 6 illustrates a headphone incorporating the device of this invention.

The device illustrated in FIG. 5 is especially adapted for incorporation directly into headphones and such a headphone is illustrated in FIG. 6. FIG. 6 shows a headphone with off/on switch 60 and sensitivity adjustment 62 corresponding respectively to switch 56 and potentiometer 54.

Although the present invention has been described with reference to particular embodiments, it will be apparent to those skilled in the art that variations and modifications can be substituted therefor without departing from the principles and spirit of the invention.

I claim:

1. An accessory device for use with a metal detector of the type using earphones, said device being connected to the audio output of said metal detector comprising:

means to amplify low audio signals from said audio output to easily audible levels:

means to dampen loud signals causing those signals to be softer including:

a first cable means to attach to said audio output and carry said signal to said device;

an electronic circuit within said device including:

an input having a first input line and second input line extending therefrom, said input line being interconnected by said first cable means to said audio output;

a transistor having a base, emitter and collector;

said first input line extending to the base of said transistor;

said second input line extending to the emitter of said transistor;

a capacitor on said first input line between said input and the base of said transistor;

a first resistor, one end of which is attached to said first input line between said capacitor and said input and the second end of which is attached to said second input line between said transistor's emitter and said input;

a feedback loop with a second resistor thereon extending from said transistor's collector and said first input line between said capacitor and the base of said transistor;

a power source such as a 1.5 volt battery on said second input line;

a ground between said power source and said first resistor on said second input line;

a line interconnecting said transistor's emitter to said ground;

a first output line extending from said transistor's collector;

a second output line extending from said power source;

said means for dampening loud signals including:

a first diode on said first output line directed to conduct electricity away from said transistor's collector;

a second diode on said second output line directed to conduct electricity toward said power source; and a second cable means attaching said first and second output lines to said earphones.

2. An accessory device for use with a metal detector of the type using earphones, said device being connected to the audio output of said metal detector comprising:

means to amplify low audio signals from said audio output to easily audible levels:

means to dampen loud signals causing those signals to be softer including:

a first cable means to attach to said audio output and carry said signal to said device;

an electronic circuit within said device including:

an input having a first input line and second input line extending therefrom, said input line being interconnected by said first cable means to said audio output;

a transistor having a base, emitter and collector;

said first input line extending to the base of said transistor;

said second input line extending to the emitter of said transistor;

a capacitor on said first input line between said input and the base of said transistor;

a first resistor, one end of which is attached to said first input line between said capacitor and said input and the second end of which is attached to said second input line between said transistor's emitter and said input;

a feedback loop with a second resistor thereon extending from said transistor's collector and said first input line between said capacitor and the base of said transistor;

a power source such as a 1.5 volt battery on said second input line;

a ground between said power source and said first resistor on said second input line;

a line interconnecting said transistor's emitter to a second output line extending from said power source;

said means for dampening loud signals including:
a third resistor on said first output line;
a fourth resistor on said second output line; and
a second means attaching said first and second output lines to said earphones.

3. An accessory device for use with a metal detector of the type using earphones, said device being connected to the audio output of said metal detector comprising:

means to amplify low audio signals from said audio output to easily audible levels:

means to dampen loud signals causing those signals to be softer including:
a first cable means to attach to said audio output and carry said signal to said device;
an electronic circuit within said device including:
an input having a first input line and second input line extending therefrom, said input line being interconnected by said first cable means to said audio output;
a transistor having a base, emitter and collector;
said first input line extending to the base of said transistor;
said second input line extending to the emitter of said transistor;
a capacitor on said first input line between said input and the base of said transistor;
a first resistor, one end of which is attached to said first input line between said capacitor and said input and the second end of which is attached to said second input line between said transistor's emitter and said input;
a feedback loop with a second resistor thereon extending from said transistor's collector and said first input line between said capacitor and the base of said transistor;
a power source such as a 1.5 volt battery on said second input line;
a ground between said power source and said first resistor on said second input line;
a line interconnecting said transistor's emitter to said ground;
a first output line extending from said transistor's collector;
a second output line extending from said power source;
said means for dampening loud signals including:
an adjustable variable resistor on said second output line; and
a second cable means attaching said first and second output lines to said earphones.

4. An accessory device for use with a metal detector of the type using earphones, said device being connected to the audio output of said metal detector comprising:

means to amplify low audio signals from said audio output to easily audible levels:

means to dampen loud signals causing those signals to be softer including:
a first cable means to attach to said audio output and carry said signal to said device;
an electronic circuit within said device including:
an input having a first input line and second input line extending therefrom, said input line being interconnected by said first cable means to said audio output;
a transistor having a base, emitter and collector;
said first input line extending to the base of said transistor;
said second input line extending to the emitter of said transistor;
a capacitor on said first input line between said input and the base of said transistor;
a first resistor, one end of which is attached to said first input line between said capacitor and said input and the second end of which is attached to said second input line between said transistor's emitter and said input;
a feedback loop with a second resistor thereon extending from said transistor's collector and said first input line between said capacitor and the base of said transistor;
a power source such as a 1.5 volt battery on said second input line;
a ground between said power source and said first resistor on said second input line;
a line interconnecting said transistor's emitter to said ground;
a first output line extending from said transistor's collector;
a second output line extending from said power source;
said means for dampening loud signals including:
an adjustable variable resistor on said second output line;
a double pole throw switch having its first pole interconnected in a first position to break said first input line and direct said first input to said second output line and in its second position, to maintain continuity in said first input line to said base of said transistor, and having its second pole interconnect in its first position said second input line to said first output line and in its second position to maintain continuity of said second input line to said power source; and
a second cable means attaching said first and second output lines to said earphones.

5. The device of claim 4 wherein said device is contained within an earphone including an off/on switch corresponding to said double pole double throw switch and a volume control being the adjustment of said adjustable variable resistor.

* * * * *